United States Patent [19]

Nichols, III

[11] Patent Number: 5,045,823
[45] Date of Patent: Sep. 3, 1991

[54] TERMINATING SCHEME FOR TRANSMITTING MULTIPLE SIGNALS ON A COAXIAL CABLE TO MULTIPLE TAP OUTLETS

[75] Inventor: Edward L. Nichols, III, Annapolis, Md.

[73] Assignee: Smart House Limited Partnership, Upper Marlboro, Md.

[21] Appl. No.: 395,593

[22] Filed: Aug. 18, 1989

[51] Int. Cl.$^5$ .............................................. H03H 7/46
[52] U.S. Cl. ................................... 333/132; 333/136; 455/3
[58] Field of Search ............... 333/100, 101, 112, 118, 333/124, 126, 129-132, 136; 343/858; 455/3, 6; 375/36; 340/825.02, 825.05; 358/86

[56] References Cited

U.S. PATENT DOCUMENTS

| | | | |
|---|---|---|---|
| 3,105,873 | 10/1963 | Winston et al. | 358/86 |
| 3,559,110 | 1/1971 | Wiley et al. | 333/112 |
| 3,671,885 | 6/1972 | Pennypacker | 333/112 X |
| 3,747,028 | 7/1973 | Pennypacker | 333/112 |
| 4,354,167 | 10/1982 | Terreault et al. | 333/103 |
| 4,578,702 | 3/1986 | Campbell | 333/136 X |
| 4,755,776 | 7/1988 | Preschutti | 333/100 |

FOREIGN PATENT DOCUMENTS

| | | | |
|---|---|---|---|
| 1247426 | 8/1967 | Fed. Rep. of Germany | 333/132 |
| 171117 | 10/1983 | Japan | 333/112 |

Primary Examiner—Eugene R. LaRoche
Assistant Examiner—Benny Lee
Attorney, Agent, or Firm—Cushman, Darby & Cushman

[57] ABSTRACT

The present invention utilizes a coupling tap that contains two parallel communication paths from the connection at a coaxial cable to a tap output, to which a device can be connected. One path passes high frequency signals of 30-900 megahertz, while the other passes lower frequency communication signals of 0-5 megahertz as well as DC power. Furthermore, each tap may contain a line isolating inductor that, when a particular tap is in use, isolates the portion of the coaxial cable that continues on past the tap in use for signals from 0-5 megahertz. This eliminates reflections and other line disturbances from entering the tap in use.

9 Claims, 4 Drawing Sheets

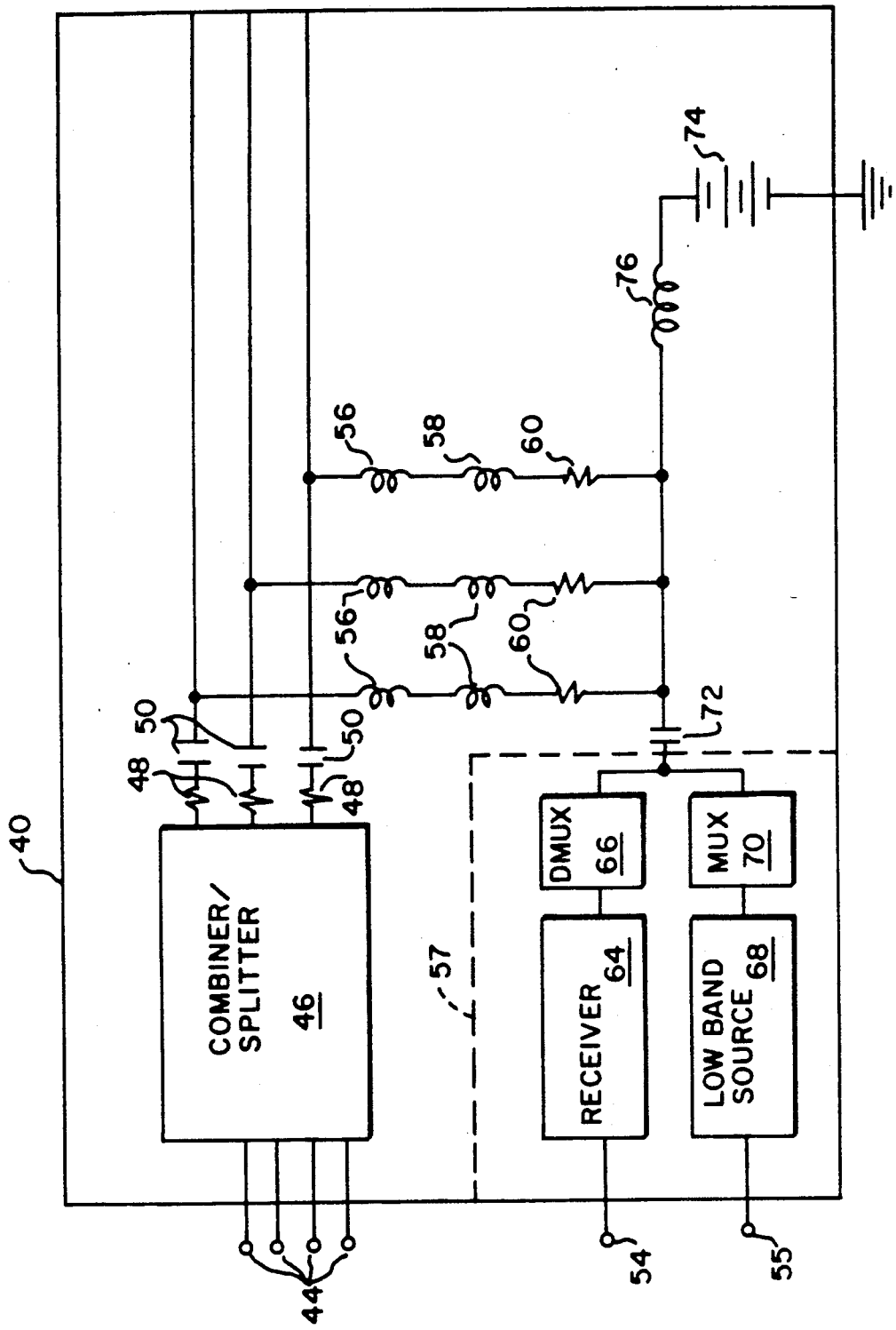

5,045,823

TERMINATING SCHEME FOR TRANSMITTING MULTIPLE SIGNALS ON A COAXIAL CABLE TO MULTIPLE TAP OUTLETS

BACKGROUND OF THE INVENTION

1. The Field of the Art

The present invention relates to taps for connecting a device to a coaxial cable transmission line so that carrier signals of varying frequencies and DC power can be efficiently transmitted to and from the device attached to the coaxial cable transmission line.

2. Description of the Prior Art

When transmitting RF signals along a coaxial cable transmission line, it is known that the tap, which connects to the coaxial cable to a device can cause degradation of the signals already on the transmission line.

U.S. Pat. No. 3,559,110 discloses a coupler that allows the sampling of a signal on a coaxial cable that improves the quality of the signal output from the coupler, which signal is described as having a frequency range of between 54 to 216 megacycles. It also illustrates a manner in which AC power can be simultaneously transmitted along the coaxial cable. However, this coupler cannot be used at low frequencies and does not disclose the transmission of DC power, which is very desirable.

It is also known to use an inductor to filter out unwanted frequencies in a coupler. However, such an inductor typically needs to be manually adjusted to alter the spacing between the coil wires and fine tune the inductance in order to obtain flat attenuation characteristics over the frequency range of interest. This is cumbersome, difficult and labor intensive.

Furthermore, because the couplers and cables attached to the couplers can cause a change in the characteristic impedance of the coaxial cable transmission line, it is difficult to connect many devices to the same coaxial cable without large signal degradation.

Thus, there still exists the need for a tap that can be placed at multiple locations along a coaxial cable, still have efficient communication of RF signals over a broad range of signal frequencies and also have bidirectional capabilities for all signal frequencies.

SUMMARY OF THE INVENTION

It is an object of the present invention to provide a tap that can be placed at multiple locations along a coaxial cable and still have efficient communication of RF signals.

It is another object of the present invention to provide a tap that can efficiently transfer RF signals of 0-5 megahertz, 30-900 megahertz, and DC power to an attached device without significant degradation and loss of the signals and DC power.

It is a further object of the present invention to provide a tap that significantly improves the quality and amplitude of 0-5 megahertz RF signals without disturbing the higher frequency RF signals of 30-900 megahertz.

In order to attain the above recited objects of the invention, among others, the present invention utilizes a coupler that contains two parallel communication paths from the connection at the coaxial cable to the tap output, which is connected to a device. One path passes high frequency RF signals of 30-900 megahertz with constant attenuation of approximately 17 decibels, while the other passes lower frequency RF signals of 0-5 megahertz as well as DC power with negligible attenuation.

Furthermore, each tap may contain a line isolating inductor that, when a particular tap is in use, isolates the portion of the coaxial cable that continues on past the tap for RF signals from 0-5 megahertz. This eliminates reflections and other line disturbances from entering the tap in use.

Thus, this tap advantageously allows the consolidation of wiring so that only one coaxial cable is necessary for the efficient transmission of these many frequencies to and from many locations along the coaxial cable.

BRIEF DESCRIPTION OF THE DRAWINGS

These and other advantages of the present invention may be appreciated from studying the following detailed description of the preferred embodiment together with the drawings in which:

FIG. 3 illustrates a block diagram of an input/output device according to the present invention;

DETAILED DESCRIPTION OF THE PREFERRED

Figure 1:
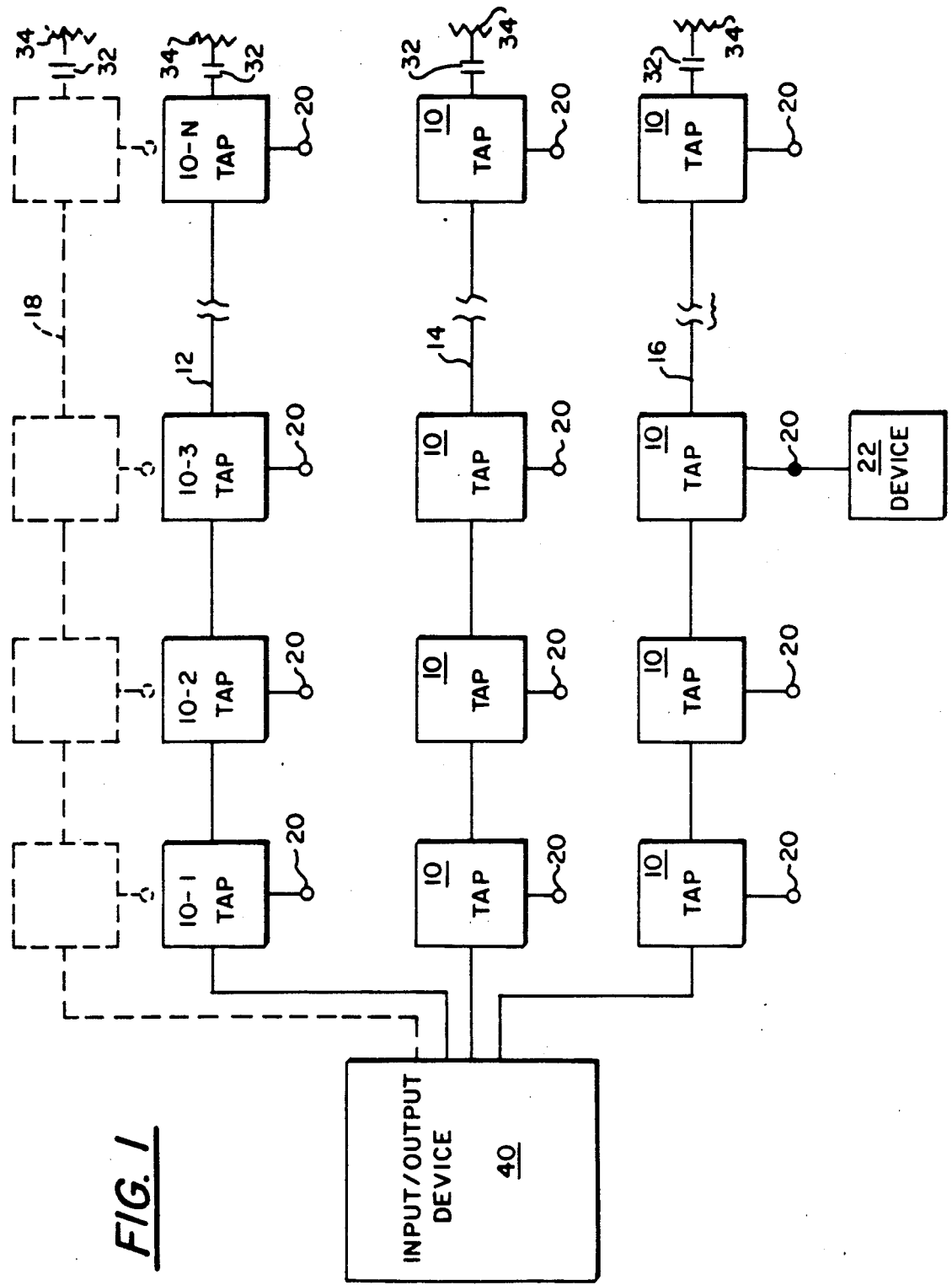
FIG. 1 illustrates a block diagram of a plurality of taps for connection of a device to a transmission line, which is connected to an input/output device, according to the present invention.

FIG. 1 illustrates a plurality of taps 10 such as taps 10-1, 10-2, 10-3 . . . 10-N, each connected to coaxial cable transmission line, such as transmission line 12, transmission line 14, and transmission line 16. More transmission lines could be attached, as indicated by the dotted path of transmission line 18. Each coaxial cable transmission line preferably has a characteristic impedance of 75 ohms.

The signal frequencies of interest are 0-5 megahertz, referred to as the low frequency, and above about 30 megahertz, referred to as the high frequency. The upper limit is determined by the structural characteristics of the coaxial cable and is typically about 900 megahertz. The high frequency signals are typically wide bandwidth RF signals such as those used for television signals. The low frequency signals are typically narrow band, RF modulated signals such as those used for telephone, intercom, or data communication, for example.

Each tap 10 contains a tap outlet 20 that allows for connection of a device 22, which can be, for example, a television, video recorder, television camera, telephone, stereo system with components such as a tape recorder and compact disc player, facsimile machine, personal computer, or other electrical equipment that utilizes communication signals that can be converted into RF low frequency signals for at least a portion of the transmission.

Figure 2:
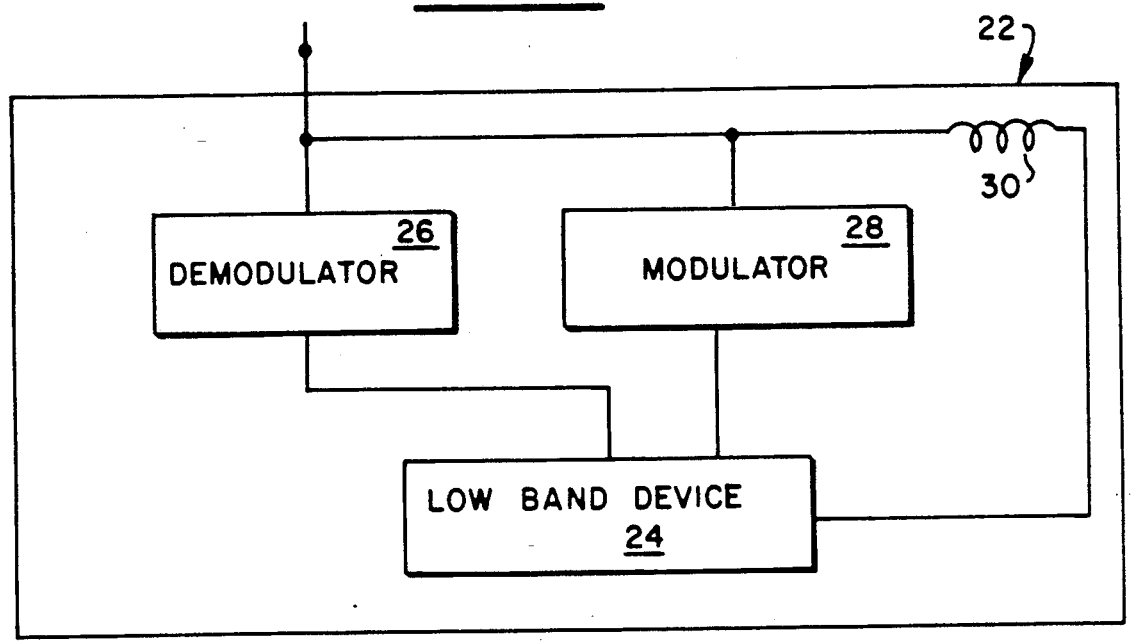
FIG. 2 illustrates a block diagram of one type of device for use with a tap according to the present invention.

One device 22 for low frequency RF applications is illustrated as a block diagram in FIG. 2. Each low band device 24 is connected to tap outlet 20 of tap 10 through a parallel arrangement of a demodulator 26, modulator 28, and DC transmitting inductor 30, respectively. Demodulator 26 allows demodulation of incoming RF signals, modulator 28 allows modulation to a predetermined RF frequency of the outgoing signals, and DC transmitting inductor 30 allows the transmission of DC power, to low band device 24.

Each coaxial cable transmission line illustrated in FIG. 1, such as transmission line 12, contains a high pass capacitor 32 and terminating resistor 34 at the terminating end. Terminating resistors 34 provide a cable terminating resistance for the high frequency signals and are preferably 75 ohms when a 75 ohm coaxial cable is being used, while high pass capacitor 32 blocks low frequency signals and DC power and has a value of about 1000 picofarads.

The transmitting and reception end of each coaxial cable transmission line attaches to input/output device 40, which is further illustrated in FIG. 3. The attachment of each coaxial cable transmission line results in a star configuration with respect to input/output device 40.

Input/output device 40 has high frequency outputs 44 for high frequency signals, and a low frequency input 52 and low frequency output 54 for low frequency signals. High frequency outputs 44 of input/output device 40 are connected to combiner/splitter 46. Combiner/splitter 46 also inputs high frequency signals from each coaxial cable transmission line, which are combined, amplified, and then output to high frequency output 44.

At the end of each coaxial cable transmission line connected to combiner/splitter 46 is attached a high pass capacitor 50 of 1000 picofarads for blocking low frequencies from combiner/splitter 46. Each coaxial cable transmission line is properly terminated in the combiner/splitter 46 using a terminating resistor 48 of 75 ohms to properly terminate the coaxial cable at the characteristic impedance.

Within input output device 40, each coaxial cable transmission line branches to establish a low frequency path through a series path of inductor 56, inductor 58, and terminating resistor 60 to low frequency input/output device 57. Inductor 56 blocks high frequency signals of over about 50 megahertz by providing an inductance of about 0.3 microhenries, inductor 58 blocks high frequency signals from about 5-50 megahertz by providing an inductance of about 3.0 microhenries, and terminating resistor 60 has a resistance of 75 ohms to provide proper termination for the low frequency path.

Each coaxial cable transmission line can receive DC power, such as 12 v, from DC, power source 74 through the low frequency path. Furthermore, the coaxial cable transmission line receives from and transmits low frequency RF signals from low frequency input/output device 57, which can receive signals from low frequency input 52, through low band source 68, modulator 70, and transmit low frequency signals along each coaxial cable transmission line. Simultaneously low frequency input/output device 57 can receive low frequency signals from the coaxial cable transmission line, which, through demodulator 66 and receiver 64, can be output to low frequency output 54 for further transmission.

DC blocking capacitor 72 blocks the DC power from modulator 70 and demodulator 66 without blocking the low frequency signals using a capacitance of 0.015 microfarads, while low frequency blocking inductor 76 blocks the low frequency signals but not DC power with an inductance of 1.6 millihenries.

It should be noted that a plurality of low frequency input/output devices 57 can be attached to allow multiple signals to be transmitted and received along each coaxial cable transmission line.

Figure 6:
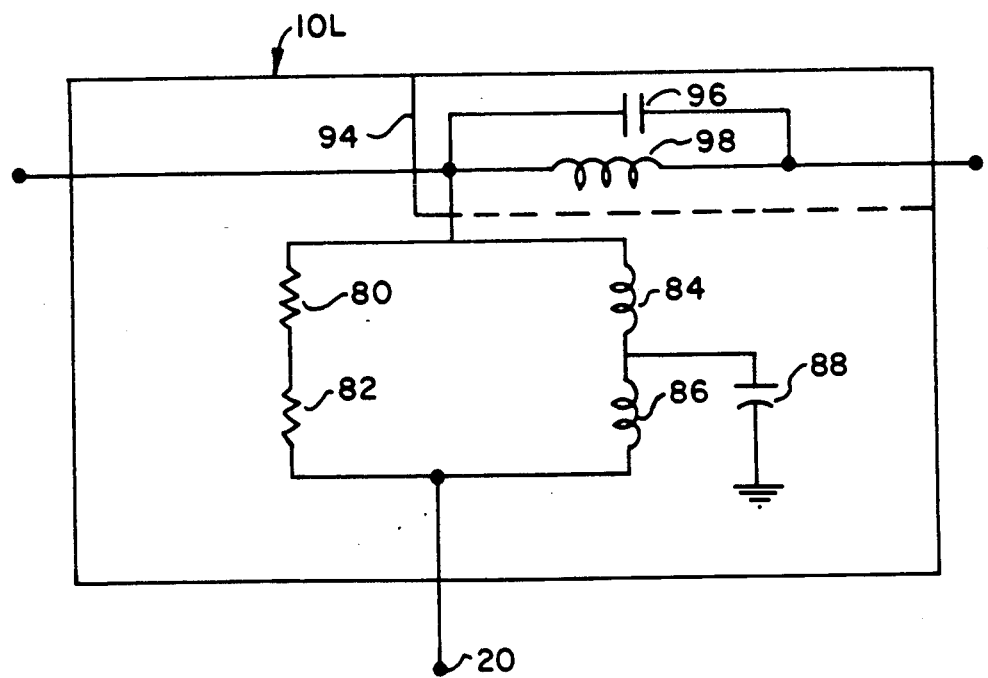
FIG. 6 illustrates a third embodiment of a tap according to the present invention.
Figure 4:
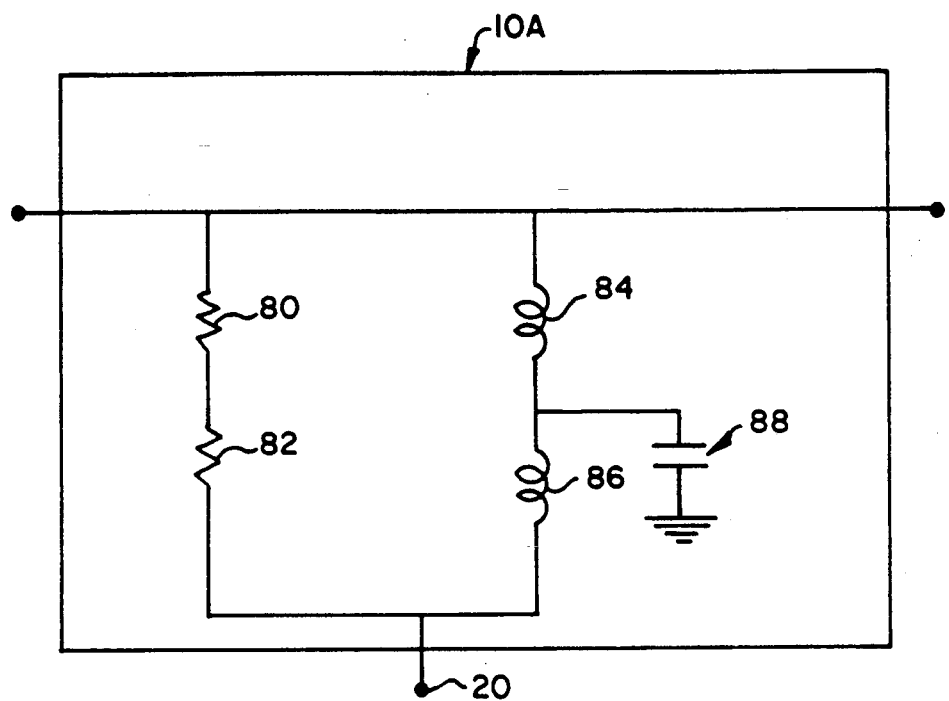
FIG. 4 illustrates one embodiment of a tap according to the present invention.
Figure 5:
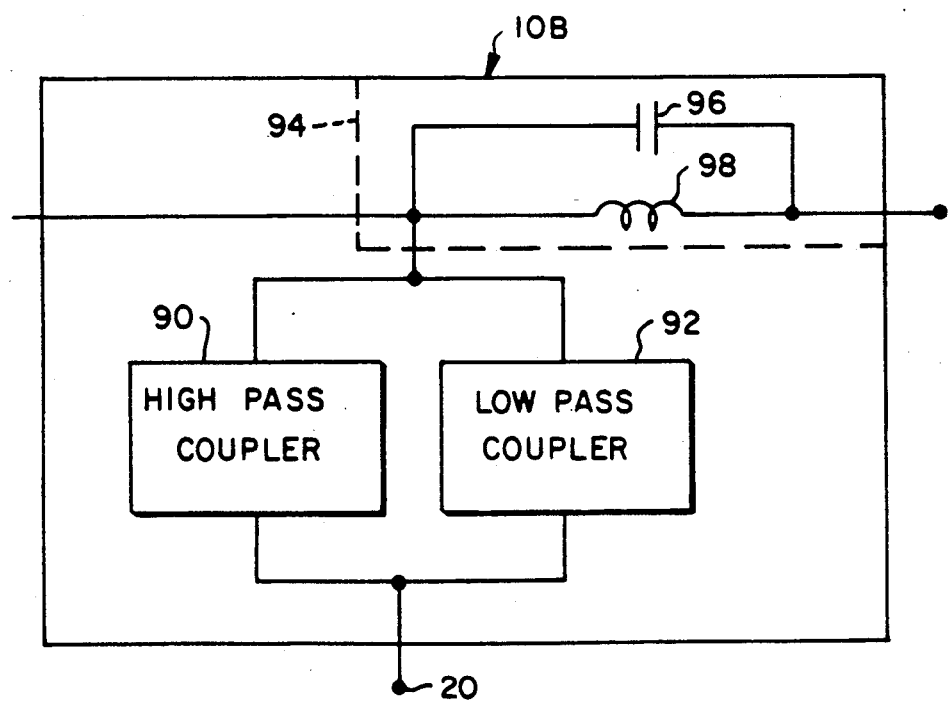
FIG. 5 illustrates a second embodiment of a tap according to the present invention.

Various embodiments of tap 10, connected to each coaxial cable transmission line, are illustrated in FIGS. 4-6, and will be separately described.

Tap 10A, illustrated in FIG. 4, provides for bidirectional coupling of both the high and low frequency signals to tap outlet 20 from the coaxial cable transmission line. The coaxial cable transmission line for this tap 10A embodiment can be made from a single coaxial cable. High frequency signals traverse a resistor path of 330 ohms through resistor 80 and resistor 82. Two separate resistors 80 and 82 rather than a single resistor with twice the resistance to decrease the parasitic capacitance. The resistance value of 330 ohms provides a signal attenuation of approximately 17Db. Low frequency signals travel an inductor path through inductor 84 and inductor 86, which have the same values and serve the same purpose as inductor 56 and inductor 58 in FIG. 3.

It should be noted that the use of two inductors for the different frequencies of interest is very advantageous because it allows flat attenuation of all high frequency signals in a simple manner. As previously described, if only one inductor is used, the coil spacing must be manually altered to provide these characteristics. The use of two inductors make this adjustment unnecessary because inductor 56 and inductor 84 have a wider spaced coil construction with constant attenuation over a wide range of frequencies than inductor 58 and inductor 86.

Furthermore, capacitor 88, which has a value of 33 picofarads, causes a sharper transition slope between the low and high bands.

When a tap 10A as described above is used for attachment of a device 22 as illustrated in FIG. 1, bidirectional signals for both low and high frequencies can be transmitted without large signal degradation.

However, if it is desired to further improve the signal characteristics, primarily those of low frequency signals, tap 10B illustrated in FIG. 5 should be used. It should be noted that for this tap 10B embodiment that the coaxial cable transmission line is actually a plurality of coaxial cables, one cable connected between each tap and one cable connected between the first tap, such as tap 10A in coaxial cable transmission line 12 and input-/output device 40.

Tap 10B includes a high pass coupler 90 and low pass coupler 92, which can be of the type described in FIG. 4. A specific example of tap with a high pass coupler, low pass coupler, and suitable transmitting means 94 is illustrated in FIG. 6. Other types of low pass and high pass couplers can be used. One design of high pass coupler 90 that provides less variation with high frequencies is a standard directional high pass coupler as is known in the art.

Of primary interest with respect to tap 10B is switchable transmitting means 94, which consists of a parallel arrangement of high frequency passing capacitor 96 and switchable line isolating inductor 98. When switchable transmitting means 94 is inserted into the coaxial cable transmission line at tap 10B, high frequency signals pass unimpeded through high frequency passing capacitor 96, which has a capacitance of 33 picofarads, to taps and devices connected further down the coaxial cable transmission line. However, switchable line isolating inductor 98 is a DC saturable inductor that changes its inductance value in accordance with the DC current flowing through the its coil. For a high DC current, on the order of 10 mA, switchable line isolating inductor 98 will have a low inductance of about 2 microhenries, which allows unimpeded passage of DC power and low frequency signals without large power or signal losses. This condition will occur when a device connected further down the coaxial cable transmission line is connected and drawing a DC current of about 10 mA, which almost all device 22 will require.

In many instances there will be only one device 22 along a coaxial cable transmission line, such as transmission line 12, that requires DC power and low frequency signal input. In that condition, the portion of the coaxial cable transmission line downstream is unnecessary and disadvantageously draws power and provides connections that cause further signal degradation due to, for example, signal reflections. The present invention prevents this with the switchable line isolating inductor 98 that changes inductance.

In an initial state, with no device 22 attached and requiring DC power, each switchable line isolating inductor 98 in every tap 10B attached to a coaxial cable transmission line has a high inductance value. Thus, DC power is not required and will not be transmitted because a proper resistive path to ground does not exist. When a device is connected to a tap, such as tap 10-3 in FIG. 1, DC current flows through the switchable line isolating inductor 98 in both taps 10-1 and 10-2, which change to their low impedance state, through low pass coupler 92, and to device 22 through tap outlet 20 because a proper low resistance path then exists. Switchable line isolating inductor 98 in tap 10-3 is still in the high inductance state and presents a high impedance to the DC power and low frequency signals, thereby effectively isolating the coaxial cable transmission line downstream of tap 10-3. This then prevents reflections that can occur further down the coaxial cable transmission line.

When the device is disconnected, DC power is no longer required. The other alternating frequency signals on the coaxial cable transmission line then demagnetize the coils to the high inductance state.

If desired, the alternating signal being received by the attached device could be generated for about 2-5 seconds after disconnection of the device to effectively demagnetize those coils of each switchable line isolating inductor 98 in the low inductance state.

It should be noted that if the attached device transmits a low frequency signal required further down the coaxial cable transmission line, that attached device will require DC power and therefore, each intermediary switchable line isolating inductor 98 on each tap 10B will be switched to a low inductance state.

While the invention has been described in connection with what is presently considered to be the most practical and preferred embodiments, it is understood that the invention is not limited to the disclosed embodiment. For example, combiner/splitter 46 illustrated in FIG. 1 could contain a separate combiner and splitter, the combiner having a separate output and the splitter having a separate input to allow more flexibility. Thus the present invention is intended to cover various modifications and equivalent arrangements included within the spirit and scope of the appended claims.

I claim:

1. An apparatus for coupling a plurality of signals of various frequencies from a coaxial cable to a device, comprising:
    means for receiving said plurality of signals from said coaxial cable;
    means for outputting said plurality of signals to said device;
    high frequency coupling means connected between said receiving means and outputting means for coupling signals having a frequency greater than substantially 30 megahertz to said outputting means from said receiving means; and
    low frequency coupling means connected between said receiving means and outputting means for coupling signals having a frequency less than substantially 5 megahertz to said outputting means from said receiving means, said low frequency coupling means comprising:
    a first inductor means for filtering signals having a frequency substantially between 5 and 50 megahertz, and
    a second inductor means for filtering signals having a frequency substantially greater than 50 megahertz, said first and second inductor means connected in series between said receiving means and said outputting means and also being connected in parallel with said high frequency coupling means.

2. An apparatus according to claim 1 wherein said low frequency coupling means further includes a capacitor connected between a junction point of said first and second inductor means and ground.

3. An apparatus according to claim 2 wherein said capacitor has a capacitance of substantially 33 picofarads.

4. An apparatus according to claim 1 wherein said high frequency coupling means comprises two resistors connected in series between said receiving means and said outputting means and having a series resistance of approximately 330 ohms, said two resistors also being connected in parallel with said low frequency coupling means.

5. An apparatus according to claim 1 wherein said first inductor means has an inductance of substantially 0.3 microhenries and said second inductor means has an inductance of substantially 3 microhenries.

6. The apparatus according to claim 1 wherein said first inductor means is a first inductor having a first inductance and said second inductor means is a second inductor having a second inductance different than said first inductance.

7. An apparatus for coupling a plurality of signals of various frequencies and DC power from a first coaxial cable to a first device and transmitting said plurality of signals of various frequencies and DC power to a second coaxial cable for coupling to a second device, said first and second coaxial cables forming a transmission line, said apparatus comprising:
    means for receiving said plurality of signals from said first coaxial cable;
    device outputting means for outputting said plurality of signals to said first device;
    cable outputting means for outputting said plurality of signals to said second coaxial cable;
    high frequency coupling means connected between said receiving means and device outputting means for coupling signals having a frequency greater than substantially 30 megahertz to said device outputting means from said receiving means; and low frequency coupling means connected between said receiving means and device outputting means and coupled in parallel with said high frequency coupling means for coupling signals having a frequency less than substantially 5 megahertz and including DC power, to said device outputting means from said receiving means; and transmitting means connected between said receiving means and said cable outputting means for constantly coupling said signals having a frequency greater than substantially 30 megahertz to said cable outputting means and coupling said signals having a frequency less than substantially 5 megahertz and DC power to said cable outputting means only when said second device is attached to said second coaxial cable and inputs said DC power.

8. An apparatus according to claim 7 wherein said transmitting means comprises a capacitor in parallel with an inductor, said inductor changing from a high inductance to a low inductance when said second device inputs said DC power.

9. An apparatus according to claim 8 wherein said high inductance is substantially 800 microhenries and said low inductance is substantially 2 microhenries.

* * * * *